United States Patent
Li et al.

(10) Patent No.: US 9,508,769 B1
(45) Date of Patent: Nov. 29, 2016

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Sheng-Chan Li, Tainan (TW); Chih-Hui Huang, Tainan County (TW); Cheng-Yuan Tsai, Hsin-Chu County (TW); Yeur-Luen Tu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/012,288

(22) Filed: Feb. 1, 2016

(51) Int. Cl.
*H01L 27/146* (2006.01)
*H01L 21/762* (2006.01)
*H01L 21/768* (2006.01)

(52) U.S. Cl.
CPC ....... *H01L 27/1463* (2013.01); *H01L 27/1462* (2013.01); *H01L 27/14621* (2013.01); *H01L 27/14629* (2013.01); *H01L 27/14683* (2013.01); *H01L 21/76224* (2013.01); *H01L 21/76898* (2013.01)

(58) Field of Classification Search
CPC .................. H01L 27/1463; H01L 27/14629
See application file for complete search history.

(56) References Cited

U.S. PATENT DOCUMENTS

| | | | |
|---|---|---|---|
| 7,271,110 B2* | 9/2007 | Lu | C23C 16/345 257/E21.276 |
| 7,315,014 B2* | 1/2008 | Lee | H01L 27/1464 250/208.1 |
| 7,492,027 B2* | 2/2009 | Mouli | H01L 27/1463 257/233 |
| 7,511,257 B2* | 3/2009 | Lee | H01L 27/14623 250/208.1 |
| 8,354,678 B1* | 1/2013 | Fox | H01L 27/1463 257/287 |

* cited by examiner

*Primary Examiner* — William Coleman
(74) *Attorney, Agent, or Firm* — WPAT, P.C., Intellectual Property Attorneys; Anthony King

(57) ABSTRACT

Some embodiments of the present disclosure provide a semiconductor structure comprising: a substrate, a radiation-sensing region in the substrate, and a trench in the substrate including a liner over an inner wall of the trench, a FSG layer over the line, an oxide layer over the FSG layer, and a reflective material over the oxide layer. The radiation-sensing region of the semiconductor structure comprises a plurality of radiation-sensing units. The trench of the semiconductor structure separates at least two of the radiation-sensing units. The FSG layer of the semiconductor structure comprises at least 2 atomic percent free fluorine and a thickness of from about 500 to about 1300 angstroms.

20 Claims, 17 Drawing Sheets

SEMICONDUCTOR STRUCTURE AND METHOD OF MANUFACTURING THE SAME

BACKGROUND

Semiconductor image sensors are used for sensing light. Complementary metal-oxide-semiconductor (CMOS) image sensors (CIS) and charge-coupled device (CCD) sensors are widely used in various applications such as cameras, scanners, photocopiers, etc. These devices utilize an array of pixels in a substrate, including photodiodes and transistors that can absorb radiation projected toward the substrate and convert the sensed radiation into electrical signals.

A performance of an image sensor depends on, among other things, its quantum efficiency and optical crosstalk. The quantum efficiency of an image sensor indicates a number of electrons generated per number of incident photons in the image sensor. The optical crosstalk occurs when some photons incident upon a pixel are absorbed by another pixel.

Therefore, while existing semiconductor structures of image sensors and conventional methods of manufacturing image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying FIGS. 1-17. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
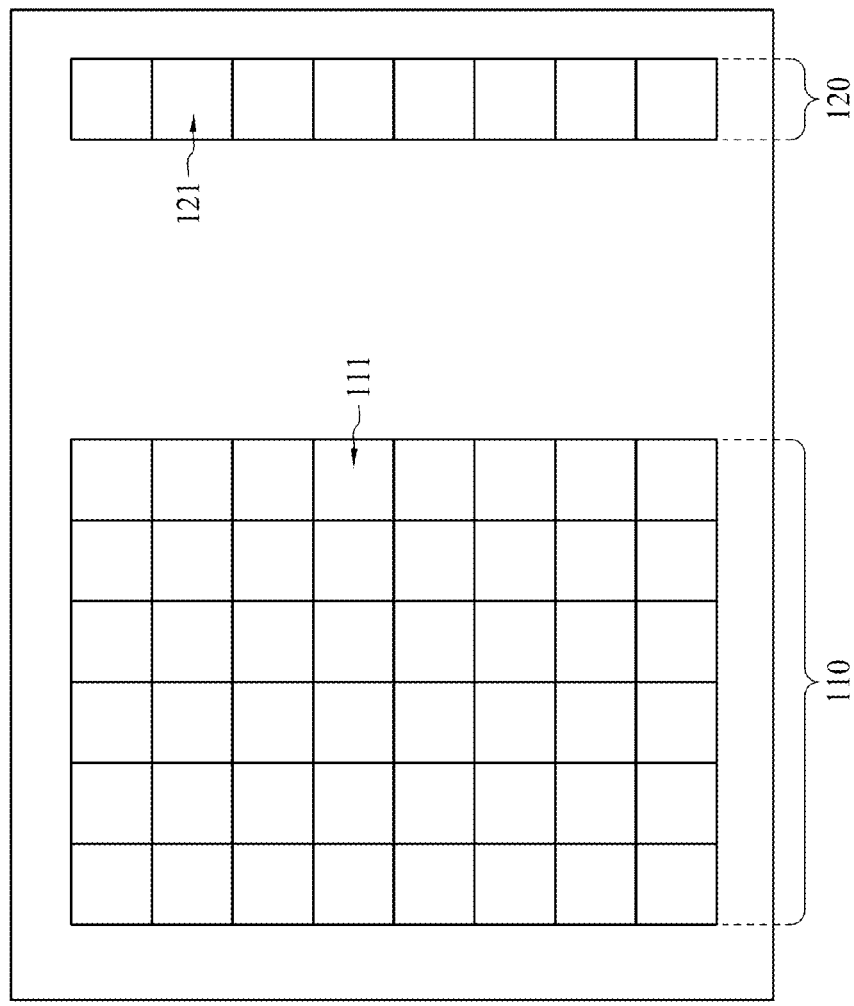
FIG. 1 is a top view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "over," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing operations and/or features of a device may be only briefly described. Also, additional processing operations and/or features can be added, and certain of the following processing operations and/or features can be removed or changed while still implementing the claims. Thus, the following description should be understood to represent examples only, and are not intended to suggest that one or more operations or features is required.

A BSI image sensor device typically needs more than two kinds of pixels, classified by the incident radiation, forming a repeating unit for the pixel array. In the conventional BSI image sensor device, a thicker silicon substrate is used for both long and short wavelengths sensing. Typically, for example, infrared (IR) and red light belongs to long wavelengths application, and green and blue light belong to short wavelengths application. These are, of course, merely examples and are not intended to be limiting. Additionally, when the size of the pixel gets smaller, it may involve more crosstalk influences between neighboring pixels. Consequently, forming backside trench isolation (BTI) between neighboring pixels is needed to solve the aforementioned issues.

In FIG. 1, a top view of an image sensor 100 is illustrated. The image sensor includes a plurality of radiation-sensing regions 110 and 120. Each of the radiation-sensing regions 110 and 120 has radiation-sensing units 111 and 121 arranged in arrays. In some embodiments, the radiation-sensing units 111 and 121 are called pixels herein. The radiation-sensing pixels 111 and 121 are configured to respectively receive a radiation projected toward the radiation-sensing pixels 111 and 121 and convert the radiation to electrical signal. In some embodiments, the radiation-sensing pixels 111 and 121 are integrated with complementary metal-oxide-semiconductor (CMOS), and the image sensor 100 is a CMOS image sensor (CIS). In some other embodiments, the radiation-sensing pixels 111 and 121 are charged coupled device (CCD) image sensors.

The image sensor 100 includes a semiconductive substrate and a plurality of radiation-sensing pixels 111 and 121 on the substrate. In some embodiments, the radiation-sensing pixels 111 and 121 are monochromatic pixels. In some other embodiments, the radiation-sensing pixels 111 and 121 are color pixels arranged to detect different wavelengths (colors) from an incident light. For example, blue (B), green (G), red (R) pixels are used. In some embodiments, the radiation-sensing pixels 111 in the radiation-sensing region 110 are red pixels and the radiation-sensing pixel 121 in the radiation-sensing region 120 are blue pixels. In some other embodiments, some of the radiation-sensing pixels in one radiation-sensing region 110 or 120 are red pixels and the rest radiation-sensing pixels in the same radiation-sensing region are blue pixels. Other color arrangements are usable in further embodiments.

In some embodiments, the image sensor 100 includes a black level reference pixel (not shown). The black level reference is similar to and arranged with a distance to the radiation-sensing pixels 111 and 121, except that a light shield is provided to prevent the black level reference pixel from receiving radiation. In such embodiments, the black level reference serves as a reference to calibrate the image sensor 100 and/or modify image data output from the radiation-sensing pixels 111 and 121.

Figure 2:
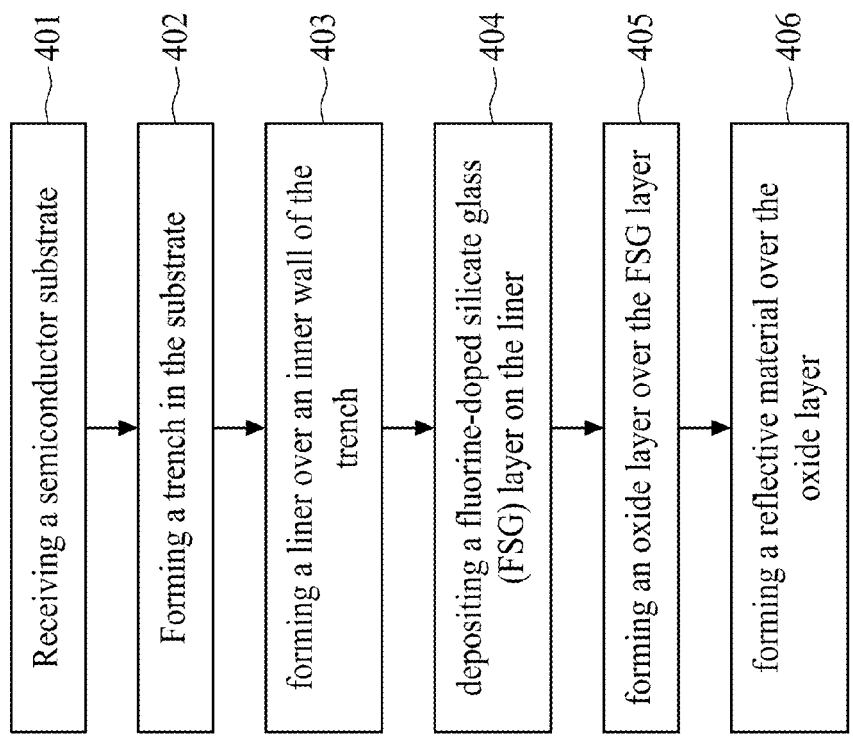
FIG. 2 is an operational flow of a method for manufacturing a trench isolation structure of an image sensor, in accordance with some embodiments of the present disclosure.

FIG. 2 illustrates an operational flow for manufacturing a semiconductor structure. In some embodiments of the present disclosure, the operational flow in FIG. 2 is used for forming the image sensor 100 illustrated in FIG. 1. In operation 401, a substrate 200 is received. A trench 210 is then formed in the substrate 200 in operation 402. Operation 403 forms a liner 211 over the trench 210. Then, in operation 404, a fluorine-doped silicate glass (FSG) layer 212 is deposited over the liner 211. In operation 405, an oxide layer 213 is formed over the FSG layer 212. Lastly, operation 406 forms a reflective material 214 over the oxide layer 213 and a semiconductor structure of the present disclosure is accomplished.

FIGS. 3 to 8 show schematic cross-sectional views of a semiconductor structure of an image sensor at various stages of manufacturing. Descriptions of these figures with references to the operational flow illustrated in FIG. 2 will be provided hereafter.

Figure 3:
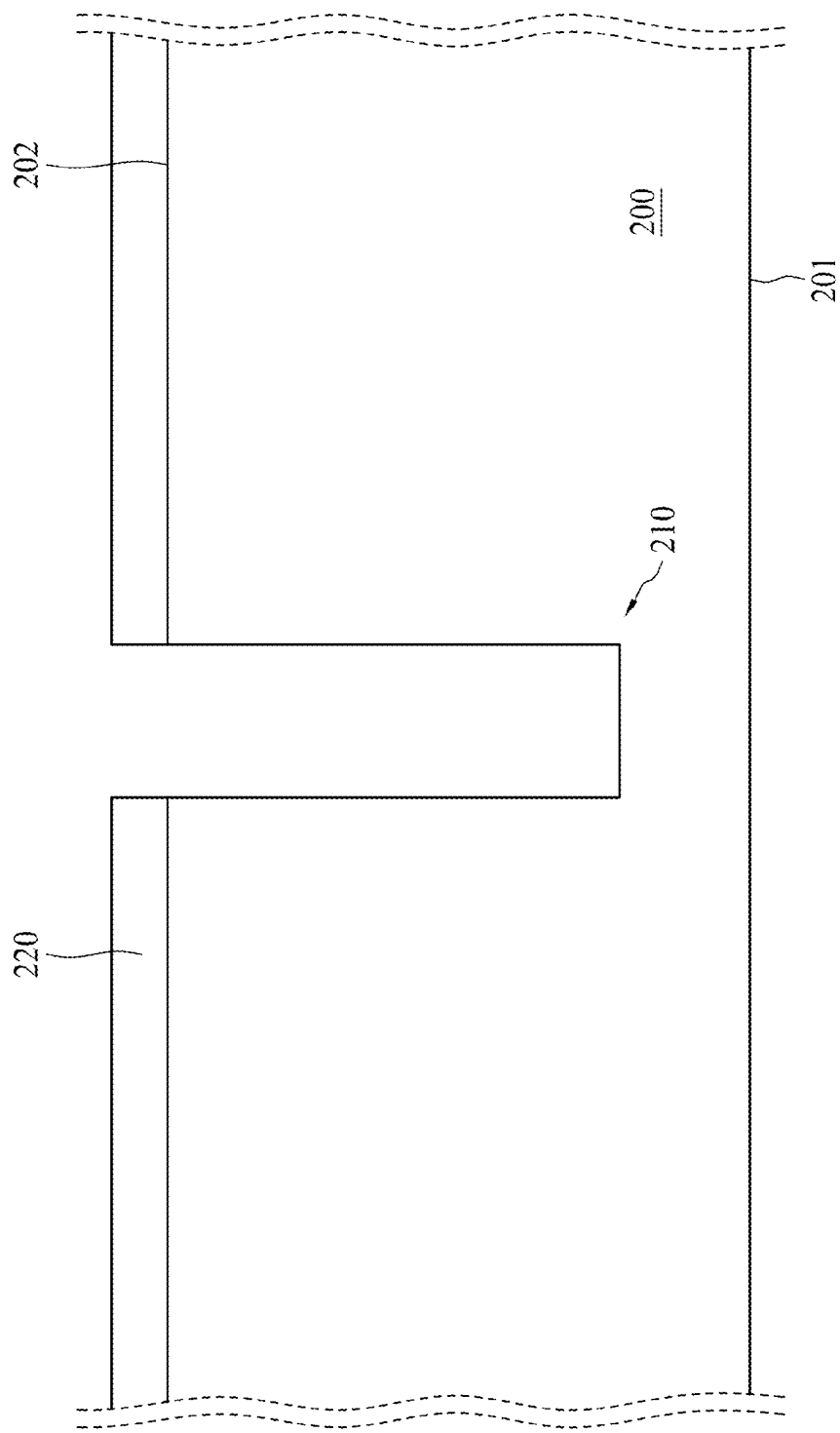
FIGS. 3-8 are schematic fragmentary cross-sectional views of a trench isolation structure of an image sensor at various stages of fabrication in accordance with some embodiments of the present disclosure.

Referring now to FIG. 3, a trench is formed in the substrate 200 through operation 402. For the sake of simplicity, only one trench 210 is illustrated in FIG. 3. The substrate 200 includes a front surface 201 and a back surface 202. A patterned hard mask layer 220 is provided to cover the back surface 202 of the substrate 200 while leaving a portion of the back surface 202 exposed. The patterned hard mask layer 220 serves as a protective mask during an etching operation for forming the trench 210. By means of the arrangement of the patterned hard mask layer 220, the positions of the arrayed radiation-sensing pixels 111 and 121 can be preliminarily determined. A possible way for forming the trench 210, for example, is a dry etching operation. After the trench 210 is fabricated, the hard mask layer 220 as shown in FIG. 3 is removed.

The trench may have approximately rectangular shapes, trapezoidal shapes, elongated elliptical shapes, or other suitable shapes. In some embodiments, the trench has a depth in a range from about 0.5 µm to about 3 µm, a width in a range from about 0.15 µm to about 0.3 µm, and an aspect ratio in a range of from about 1.5 to about 20. The trench 210 serves as a deep trench isolation structure for separating at least two radiation-sensing units and avoiding white pixels caused by optical cross-talk or electric leakage current between two adjacent radiation-sensing units.

Figure 4:
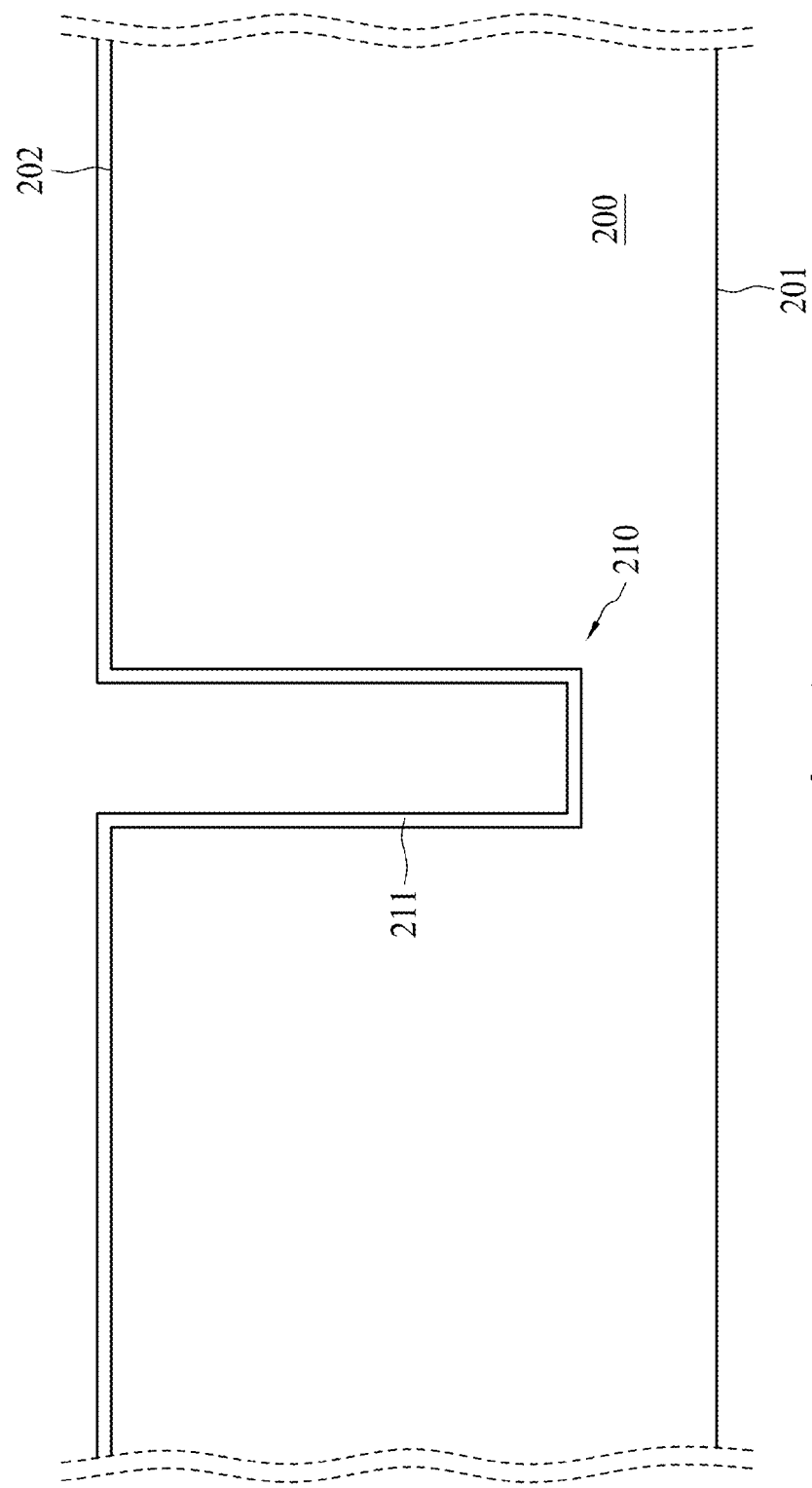

FIG. 4 shows a cross-sectional view of a semiconductor structure including a liner 211 over an inner wall of the trench 210 formed in operation 403. The liner 211 is composed of a high-k dielectric material. The high-k dielectric material, for example, can be $HfO_2$, $Al_2O_3$, $TiO_2$, HfZrO, $Ta_2O_3$, $Ta_2O_5$, $HfSiO_4$, $ZrO_2$, $ZrSiO_2$, lanthanide oxides or any combinations thereof. In some embodiments, the liner 211 includes a plurality of high-k dielectric layers which are each composed of $HfO_2$, $Al_2O_3$, $TiO_2$, HfZrO, $Ta_2O_3$, $Ta_2O_5$, $HfSiO_4$, $ZrO_2$, $ZrSiO_2$, lanthanide oxides, or any combinations thereof. Atomic layer deposition (ALD) or other suitable methods may be used to fabricate the liner 211 so that a uniform thickness of the liner 211 can be achieved over the inner wall of the trench 210.

Figure 5:
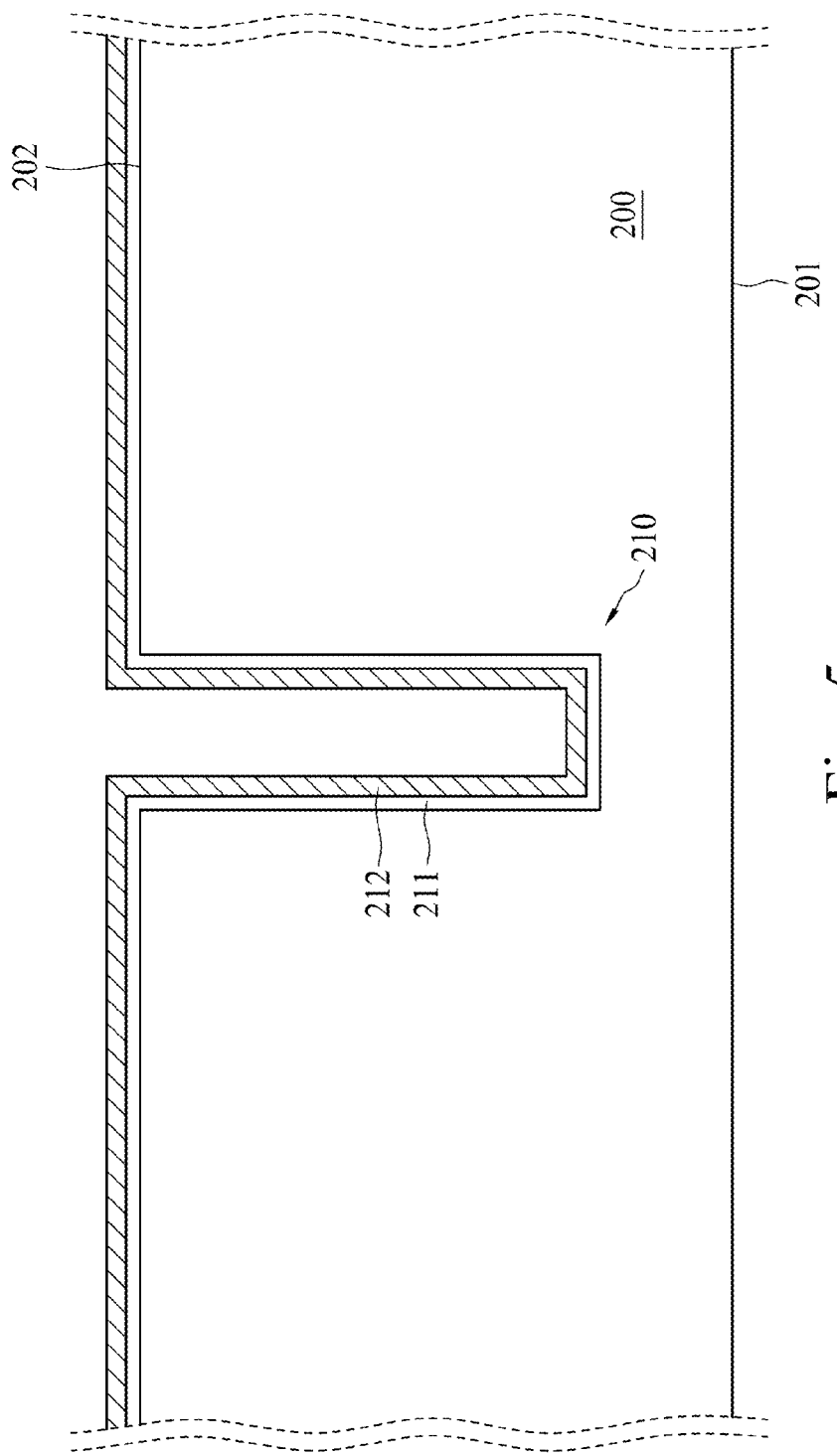

FIG. 5 shows a cross-sectional view of a semiconductor structure including a fluorine-doped silicate glass (FSG) layer 212 over the liner 211 formed in operation 404. The FSG layer 212 contains at least 2 atomic percent free fluorine (free F %) and has a uniform thickness of about 500 angstroms to about 1300 angstroms. The free fluorine represents non-bonded fluorine atoms which require less energy for diffusing in the FSG layer or diffusing from the FSG layer to the liner 211 and the substrate 200 than bonded fluorine atoms do. The FSG layer may be formed by plasma enhanced chemical vapor deposition (PECVD) or other suitable methods. For example, when PECVD is used in operation 404, a precursor including $SiF_4$ and $SiH_4$ and a RF plasma with a power from about 100 W to 150 W can be supplied for depositing the FSG layer 212. In some embodiments, the FSG layer 212 is formed over the liner 212 so that the FSG layer 212 does not contact the inner wall of the trench 210 and has substantially the same thickness at the bottom of the trench 210 and near the opening of the trench 210. That is, the liner 212 separates the inner wall of the trench 210 from the FSG layer 212 and the FSG layer 212 has a uniform thickness in a deep trench with a high aspect ratio.

Figure 6:
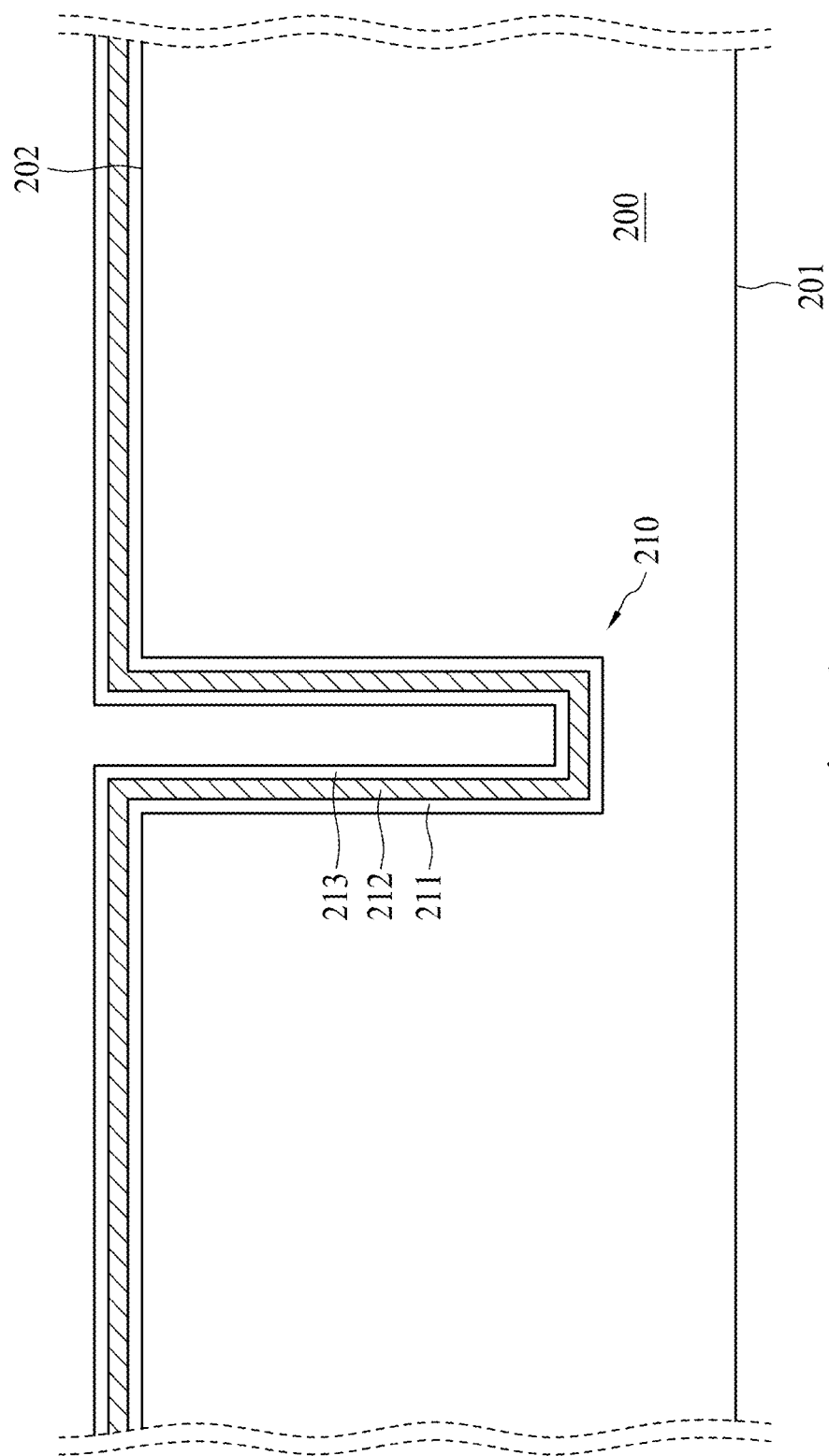

In FIG. 6, an oxide layer 213 is formed over the FSG layer 212. In some embodiments, the oxide layer 213 is formed by depositing silicon oxides over the FSG layer 212. In some embodiments, the oxide layer 213 is formed by an ultralow deposition rate.

Figure 7:
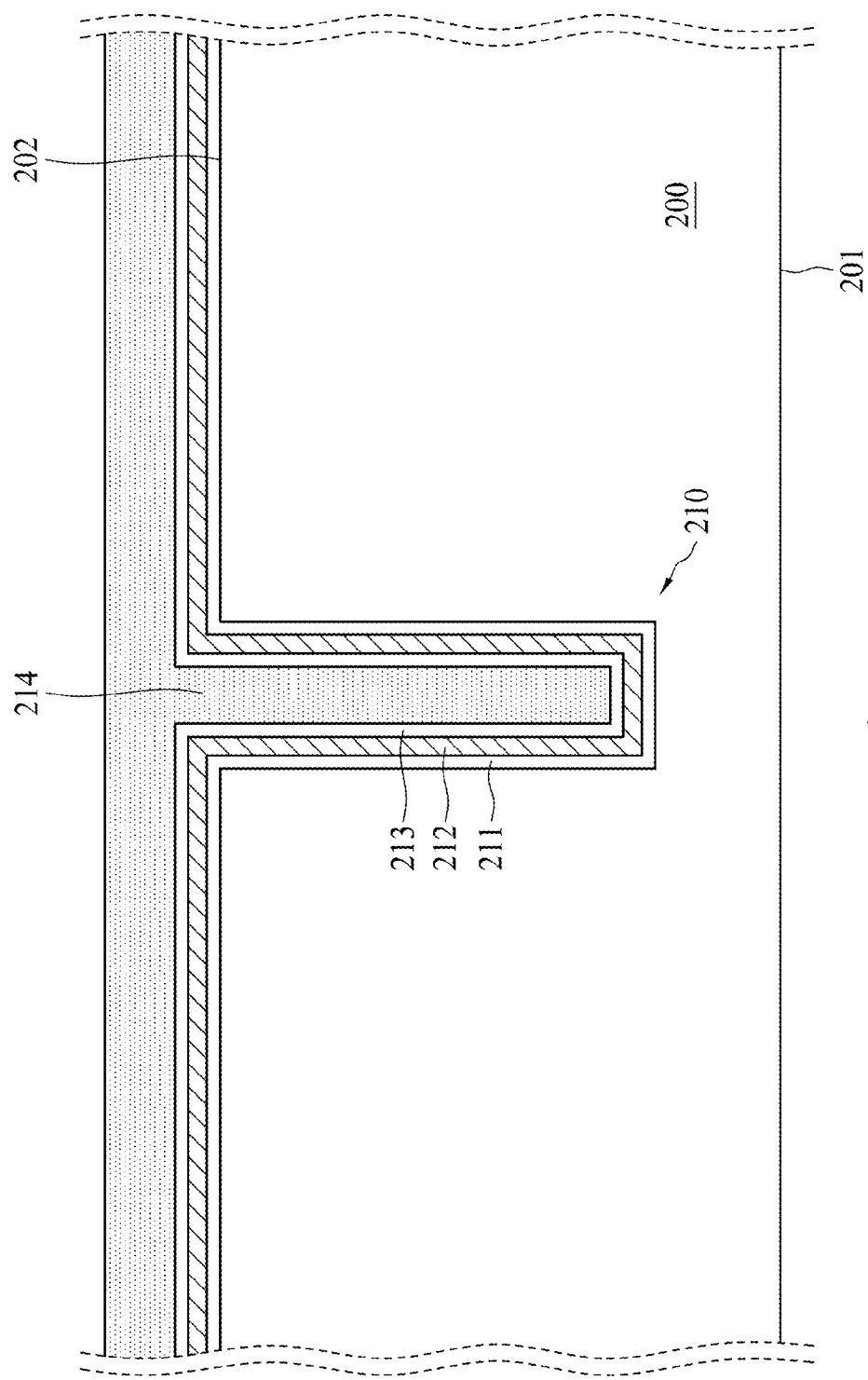
Figure 8:
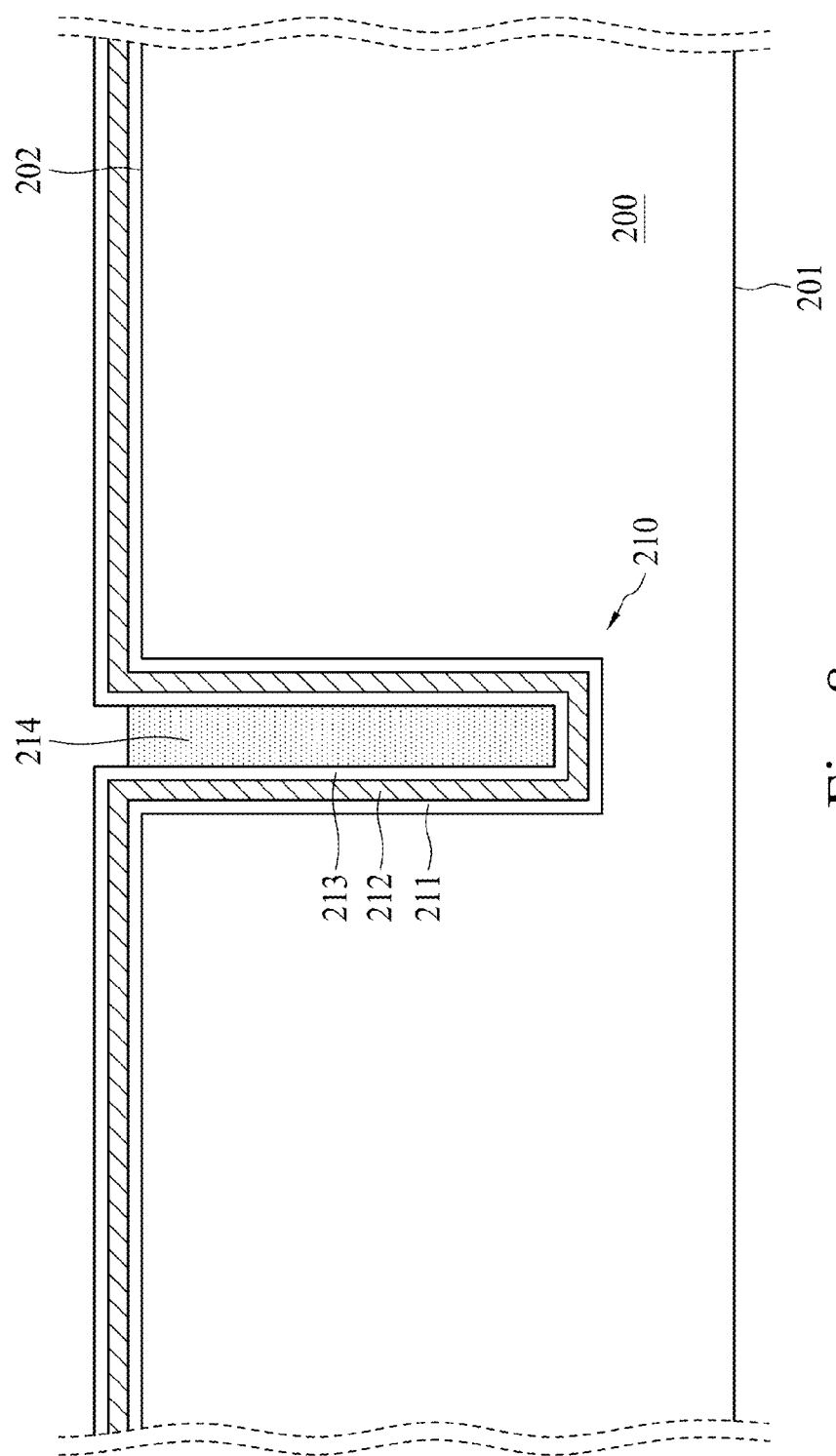

FIGS. 7 and 8 illustrate a reflective material 214 formed over the oxide layer 213 in operation 406. In FIG. 7, the reflective material 214 is deposited over the oxide layer 213 and fills the trench 210. Then, the excess reflective material 214 on the back surface 202 of the substrate 200 is to be removed until the oxide layer 213 is exposed, as shown in FIG. 8. The thinning operation is implemented by, for example, a chemical mechanical polishing operation. In some embodiments, the reflective material 214 is composed of tungsten, aluminum, copper, or any combinations thereof. The reflective material 214 serve as a reflector for a radiation projected toward the reflective material 214. As a result, the radiation projected toward the reflective material 214 from one side of the reflective material 214 is prevented from entering another side of the reflective material 214.

A semiconductor structure of the present disclosure fabricated by the operational flow of FIG. 2 is disclosed in FIGS. 3-8 and the descriptions above. However, such disclosures should be understood to represent examples only and are not intended to be limiting. For example, in some other embodiments, before the fabrication of the reflective material 214 over the oxide layer 213 in operation 406, a barrier layer (not shown) is deposited in the trench 210 to separate the reflective material 214 from the oxide layer 213. The barrier layer, for example, may be titanium nitride.

In some embodiments, the liner 211 of the present disclosure is negatively charged. Thus, the electric carriers generated in the radiation-sensing units 231 and 232 can be repelled from the liner 211 of the trench 211 and the occurrence of crosstalk as mentioned above can be avoided. Furthermore, the FSG layer 212 is positively charged. The FSG layer 212 is selected due to the fact that the amount of the positive charges it bears is not so great to an extent offsetting the negative charges of the liner 211.

In some embodiments, the liner 211 of the present disclosure separates the inner wall of the trench 210 from the FSG layer 212 in such a way that the FSG layer 212 does not contact the inner wall of the trench 210. Thus, the electric charges generated in the radiation-sensing units 231 and 232 adjacent to the trench 210 are not directly affected by the positive charges of the FSG layer 212 and the negative charges of the liner 211 may effectively prevent the electric carriers from leaking to an adjacent radiation-sensing unit. In some other preferred embodiments, the FSG layer 212 separates the liner 211 from the oxide layer 213 in such a way that the oxide layer 213 does not contact the liner 211. Since an oxide layer 213 formed of, for example, silicon oxide contains a higher concentration of positive charges than the FSG layer 212 does, separating the oxide layer 213 from the liner 211 may retain a higher repelling force to prevent the electric carriers from leaking to an adjacent radiation-sensing unit.

Figure 9:
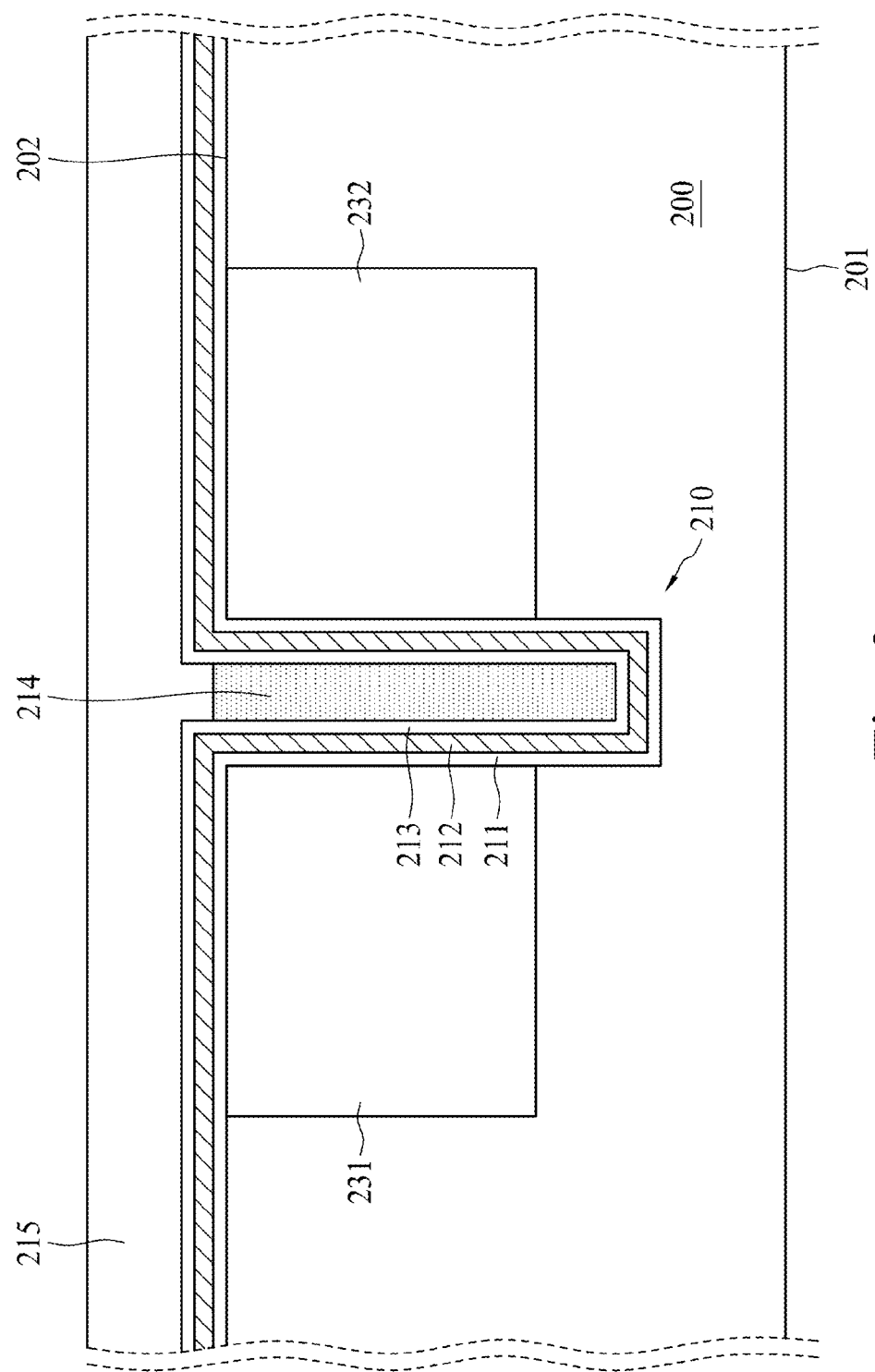
FIG. 9 is a cross-sectional view of an image sensor including a trench isolation structure, in accordance with some embodiments of the present disclosure.
Figure 10:
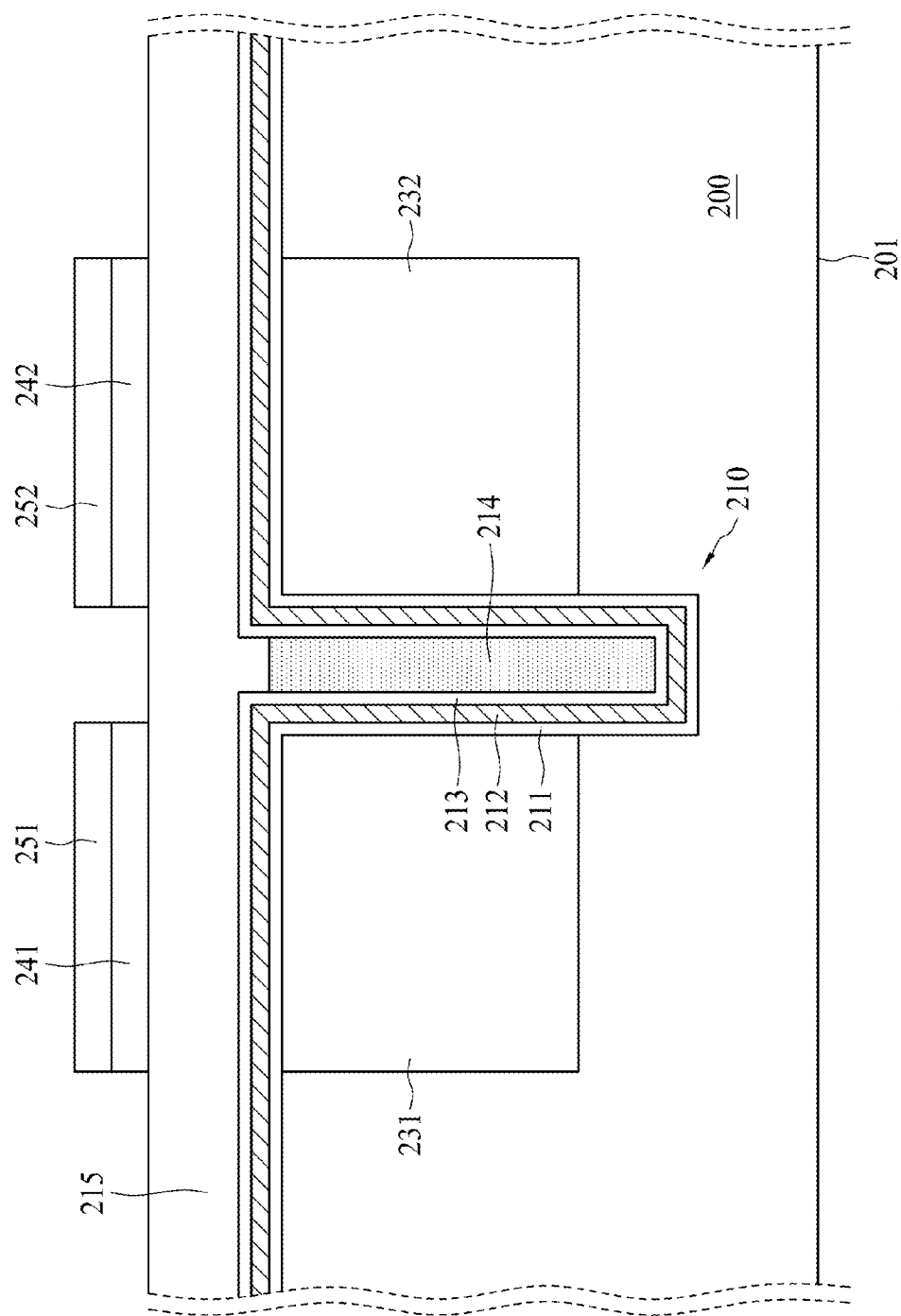
FIG. 10 is a cross-sectional view of an image sensor including a trench isolation structure, in accordance with some embodiments of the present disclosure.

FIGS. 9 and 10 illustrate an image sensor of the present disclosure including a semiconductor structure as disclosed in FIG. 8. FIG. 9 shows an image sensor including radiation-sensing units 231 and 232 formed in the radiation-sensing pixels of the substrate 200 and a cover layer 215 formed over the oxide layer 213 and the reflective material 214.

The cover layer 215 may be the same oxides as the oxide layer 213. In some embodiments, the cover layer 215 is composed of a material different from that of the oxide layer 213. After depositing the cover layer 215 over the oxide layer 213 and the reflective material 214, the cover layer 215 is thinned to an appropriate height of about 1200 to about 1800 angstroms above the back surface 202 of the substrate 200. The radiation-sensing units 231 and 232 are formed in the radiation-sensing pixels of the substrate 200. For simplicity, only two radiation-sensing units 231 and 232 are illustrated in FIG. 9.

The two radiation-sensing units 231 and 232 are arranged adjacent to the trench 210 and separated from each other by the trench 210. The trench 210 serves as a deep trench isolation structure for the image sensor to prevent a current generated in one radiation-sensing unit from leaking to an adjacent radiation-sensing unit (referred to as leakage current). Thus, the radiation-sensing units 231 and 232 are arranged with a depth smaller than the trench 210 so that they can be effectively separated by the trench 210. The radiation-sensing units 231 and 232 are formed by performing an ion implantation operation on the substrate 200 from the back surface 202. The ion implantation operation implants the substrate 200 with a dopant having an opposite doping polarity as the substrate 200. For example, in some embodiments where the substrate 35 is a P-type substrate, the radiation detection devices 160-161 are doped with an N-type dopant.

In the embodiment illustrated in FIG. 9, the radiation-sensing units 231 and 232 are formed adjacent to or near the back surface 202 of the substrate 200. In alternative embodiments, depending on the design needs and manufacturing requirements, the radiation-sensing units 231 and 232 may be formed further away from the back surface 202 of the substrate 200. The position or location of the radiation-sensing units 231 and 232 may be adjusted by tuning an implantation energy level of the implantation operation used to fabricate these radiation-sensing units 231 and 232. For example, a higher implantation energy level may be applied to achieve radiation-sensing units 231 and 232 with a greater depth.

The radiation-sensing units 231 and 232 are operable to sense or detect radiations projected toward the radiation-sensing units 231 and 232 through the back surface 202 of the substrate 200. The radiation-sensing units 231 and 232 may be able to sense or detect radiation having specific wave lengths, which may correspond to lights of different colors. In an embodiment, the radiation-sensing units 231 and 232 include a photodiode. In other embodiments, the radiation-sensing units 231 and 232 may include other types of photodiodes, photogates, reset transistors, source follower transistors, or transfer transistors. For the sake of simplicity, the structural details of the radiation-sensing units 231 and 232 are not illustrated.

Figure 11:
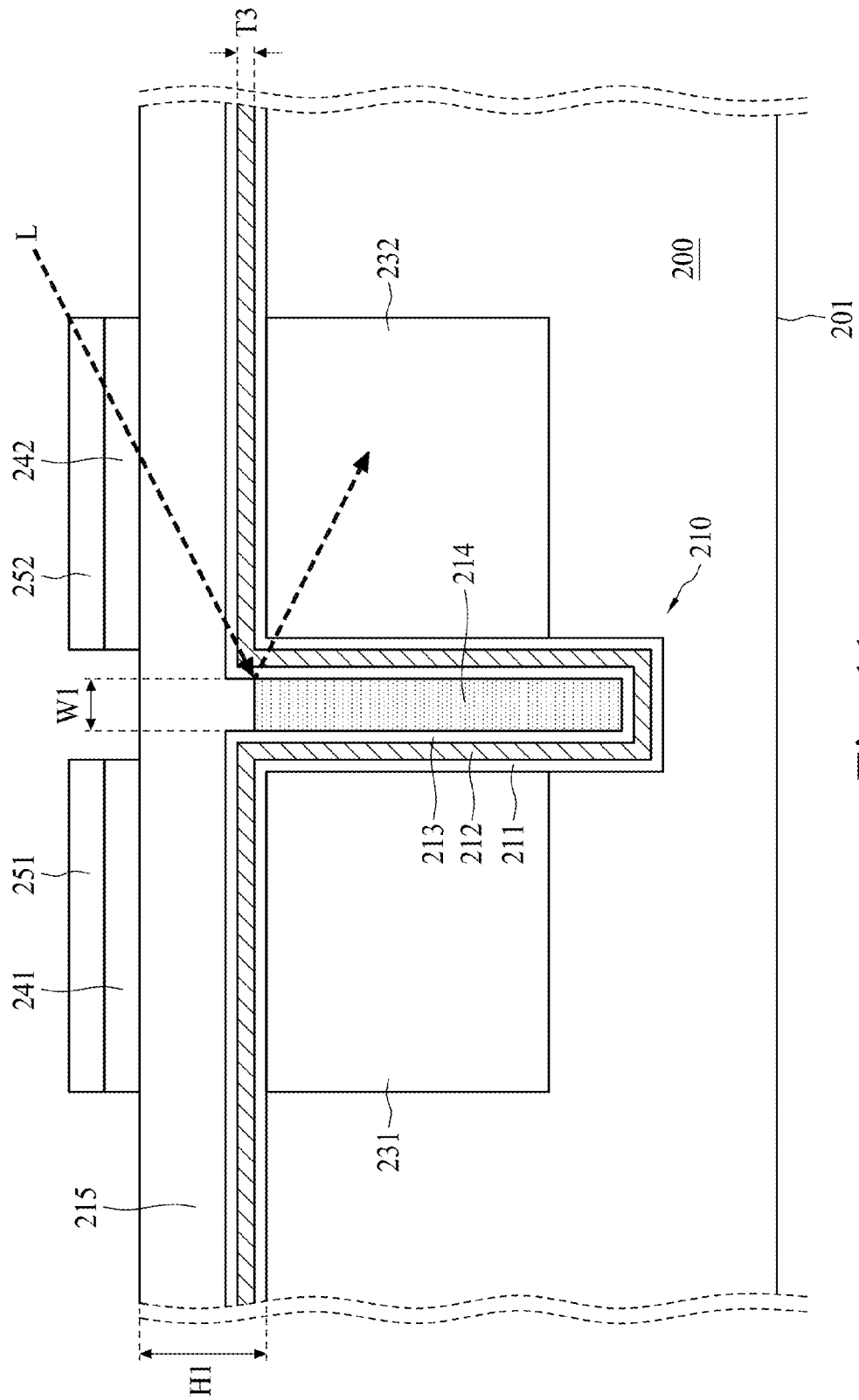
FIGS. 11 and 12 are cross-sectional views of image sensors including trench isolation structures showing different thicknesses of FSG layers.

FIG. 10 illustrates that the image sensor of FIG. 9 is further provided with an anti-reflection layer 241 and 242 and color filters 251 and 252 over the cover layer 215. Although the anti-reflection layers 241 and 242 and the color filters 251 and 252 illustrated in FIG. 11 are only arranged over the portions of the cover layer 215 above the radiation-sensing units 231 and 232, the anti-reflection layer and the color filter may be formed in other suitable configurations. For example, the anti-reflection layer and/or the color filter may be formed over the entire cover layer 215.

Figure 12:
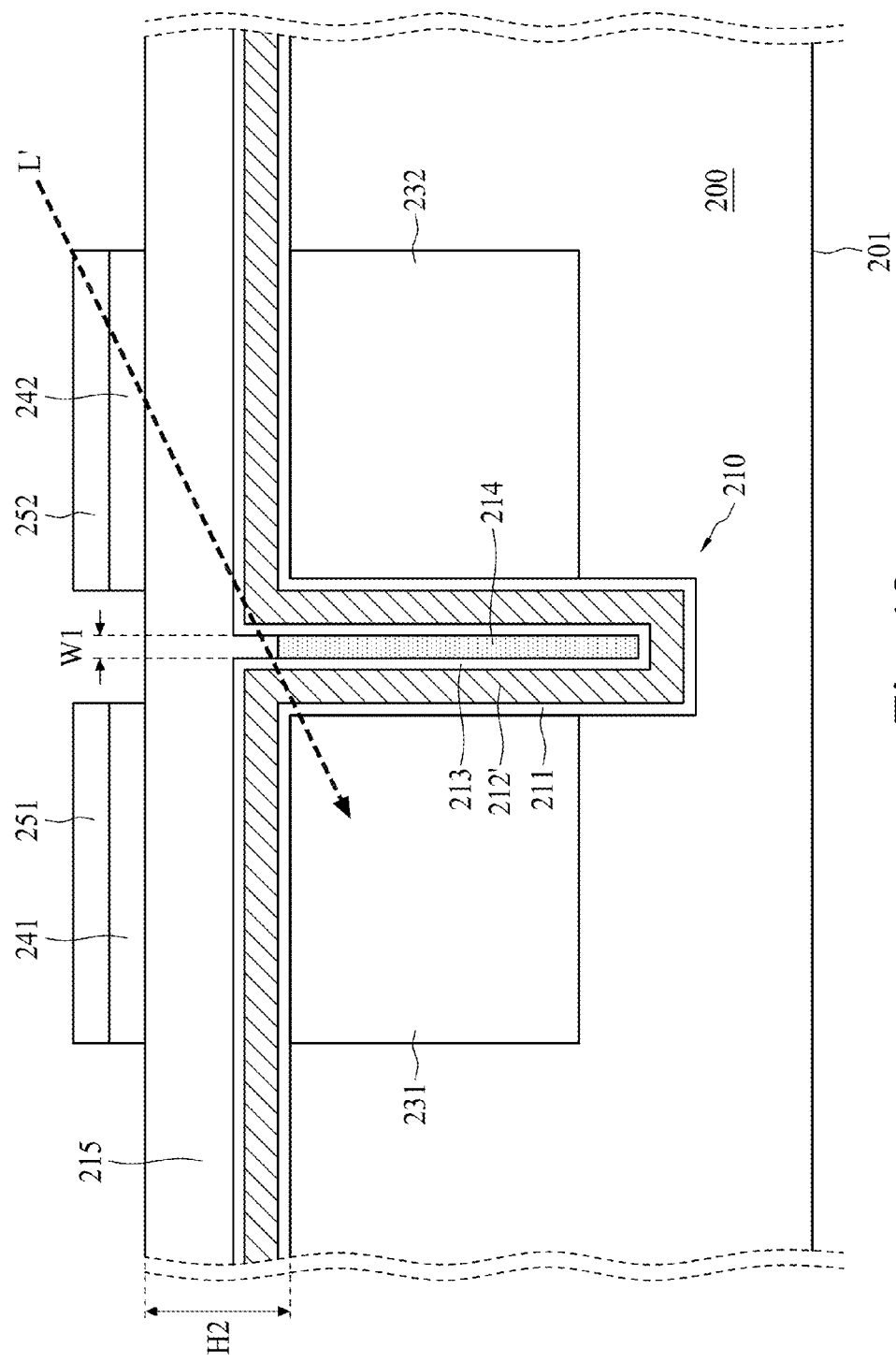
Figure 13:
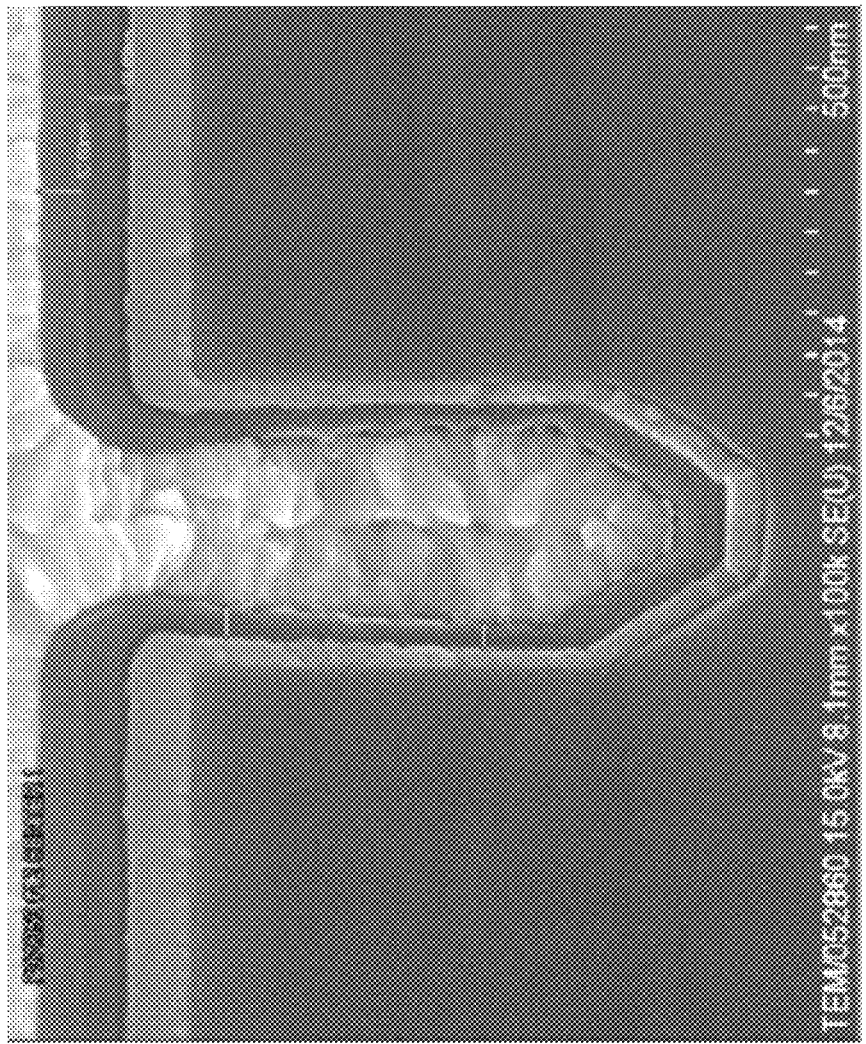
FIG. 13 is an SEM image of a trench isolation structure of an image sensor, in accordance with some embodiments of the present disclosure.

FIGS. 11 and 12 illustrate two embodiments of the image sensor including the semiconductor structure of the present disclosure. FIG. 11 is a schematic figure showing a FSG layer 212 with a thickness T13 in a range from about 500 to about 1300 angstroms (please refer to an SEM image of one of the embodiments in FIG. 13). FIG. 12 is a schematic figure showing a FSG layer 212' with a thickness substantially greater than 1300 angstroms. Other elements in FIGS. 11 and 12 are identical and thus denoted with the same numerals. In the embodiment of the FSG layer 212 of FIG. 11, the cover layer 215 has a height H1 above the back surface 202 of the substrate 200 and the reflective material has a width W1. In the embodiment of the FSG layer 212' in FIG. 12, the cover layer 215 has a height H2 above the back surface 202 and the reflective material has a width W2. Owing to the differences of thicknesses between the FSG layer 212 and the FSG layer 212', H1 is smaller than H2 and W1 is larger than W2. As a result, while the light beam L projecting with a specific incident angle to a corner of the color filter 252 is reflected back by the reflective material 214 in FIG. 11, the light beam L' with the same incident angle projected to the same corner of the color filter 252 passes over the reflective material 214 in FIG. 12. That is to say, the FSG layer 212' having a greater thickness, for example greater than 1300 angstroms, leads to a larger height of the cover layer 215 and a smaller width of the reflective material 214 so that a quantity of light beams projecting toward the radiation-sensing unit 232 are received by the adjacent radiation-sensing unit 231. In this regard, the radiation-sensing unit 231 placed in an optically dark environment detects a light beam and becomes what is referred to as a "white pixel," which is undesirable in an image sensor.

It is well known that defects or dangling bonds on the surfaces of the deep trenches may be physical defects or electrical defects and could trap carriers such as electrons. The trapped carriers may produce leakage current. Leakage current is problematic for image sensors. For example, a radiation-sensing unit which is placed in an optically dark environment may end up "sensing" light when it shouldn't have. In this situation, the leakage current may be referred to as a "dark current", and the pixel containing the radiation-sensing unit may become what is referred to as a "white pixel". Dark currents and white pixels are forms of electrical cross-talk that degrades the performance of the image sensor and are therefore undesirable.

By means of the semiconductor structure including the FSG layer 212 of the present disclosure, the aforementioned defects or dangling bonds can be recovered by the free fluorine atoms in the FSG layer 212. As a result, the white pixels can be largely reduced. Table 1 is provided below to show the concentrations of free fluorine atoms of the FSG layers in Examples 1 and 2. The FSG layer of Example 1 is formed by PECVD operation under regular power, for example, greater than 150 W, while the FSG layer of Example 2 is formed by PECVD operation under lower power, for example, less than 150 W. The precursors used in the aforesaid PECVD operation include $SiF_4$ and $SiH_4$. In Example 1, the concentration of fluorine atoms (bonded and free fluorine atoms) measured by XRF is 6.43 atomic percent and the concentration of fluorine atoms (bonded fluorine atoms) measured by FTIR is 4.873 atomic percent. Thus, the free F % of Example 1 is 1.557 atomic percent when deposited using regular RF power of, for example, 225 W. In Example 2, the concentration of fluorine atoms (bonded and free fluorine atoms) measured by XRF is 6.347 atomic percent and the concentration of fluorine atoms (bonded fluorine atoms) measured by FTIR is 3.99 atomic percent. Thus, the free F % of Example 1 is 2.357 atomic percent when deposited using low RF power of, for example, 112.5 W.

|  | Power (W) | F % (FTIR) | F % (XRF) | Free F % |
|---|---|---|---|---|
| Example 1 | 225 | 4.873 | 6.43 | 1.557 |
| Example 2 | 112.5 | 3.99 | 6.347 | 2.357 |

The free fluorine atoms in the FSG layer 212 may diffuse to the liner 211 and the substrate 200 or the radiation-sensing unit 231 and 232 to recover the oxygen defects and dangling bonds by forming robust Si—F bond, Hf—F bond, or other fluorinated bonds. By means of the free fluorine atoms in the FSG layer, the defects at the interface and the radiation-sensing units may be annihilated and thus the cross-talk between adjacent radiation-sensing unit and the white pixels can be effectively reduced. In some embodiments, the liner 211 has a thickness so thin that the free fluorine atoms may diffuse through the liner 211 to the interface between the substrate 200 and the liner 211 to neutralize the defects and dangling bonds. For example, the liner 211 may have a thickness of from about 15 Å to about 30 Å.

Figure 14:
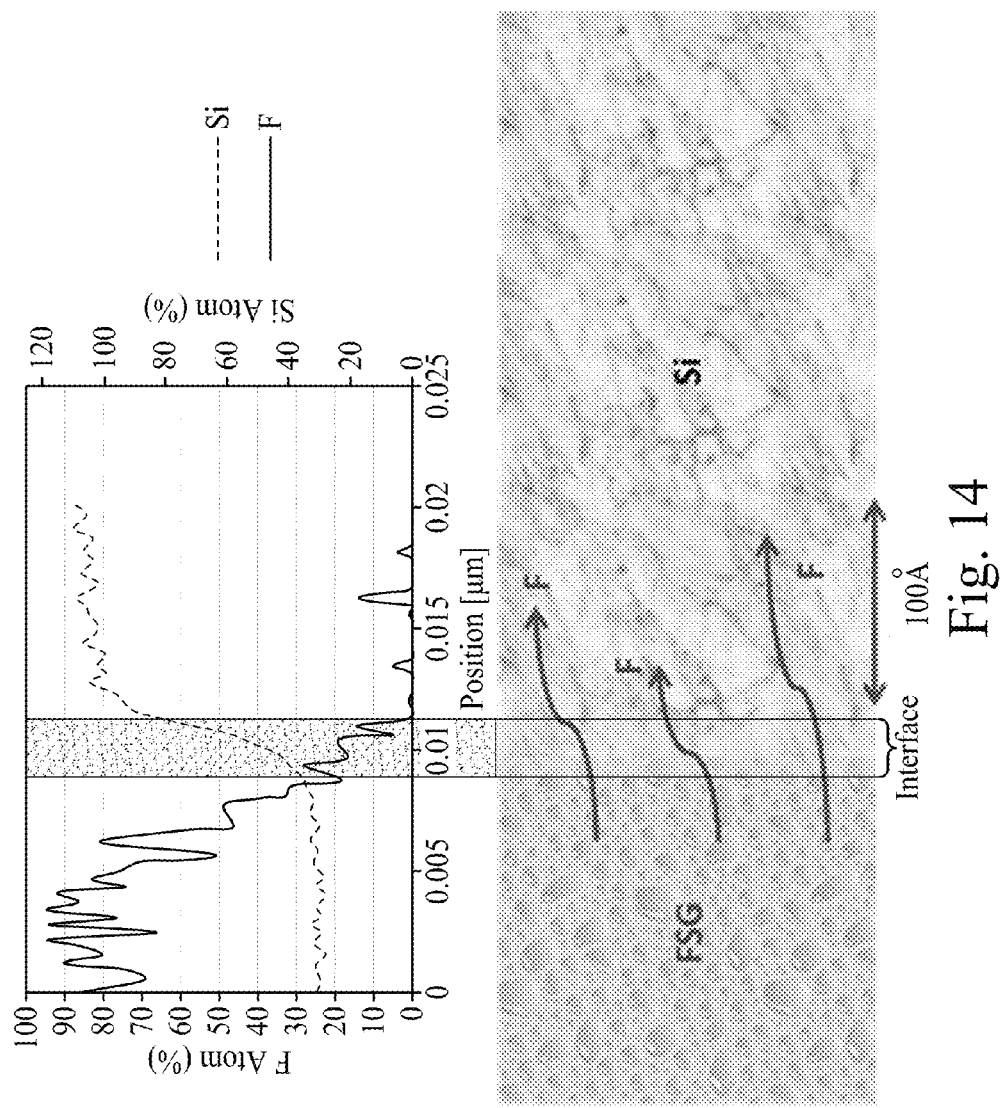
FIG. 14 illustrates a TEM image and an EDX analysis result of the interface between the FSG layer and the substrate, in accordance with some embodiments of the present disclosure.

FIG. 14 shows a TEM image and an EDX analysis result conducted at the interface between the FSG layer 212 and a Si substrate of an embodiment in accordance with the present disclosure. As shown in the EDX result, the free fluorine atoms appear in the Si substrate at a distance about 100 angstroms from the interface between the substrate and the FSG layer. This demonstrates that the free fluorine atoms in the FSG layer 212 diffuse into the substrate with a distance about 100 angstroms. Thus, the free fluorine atoms arriving at the interface and a distance of about 100 angstroms from the interface in the substrate may function to recover the dangling bonds and defects exiting in these areas.

Figure 15:
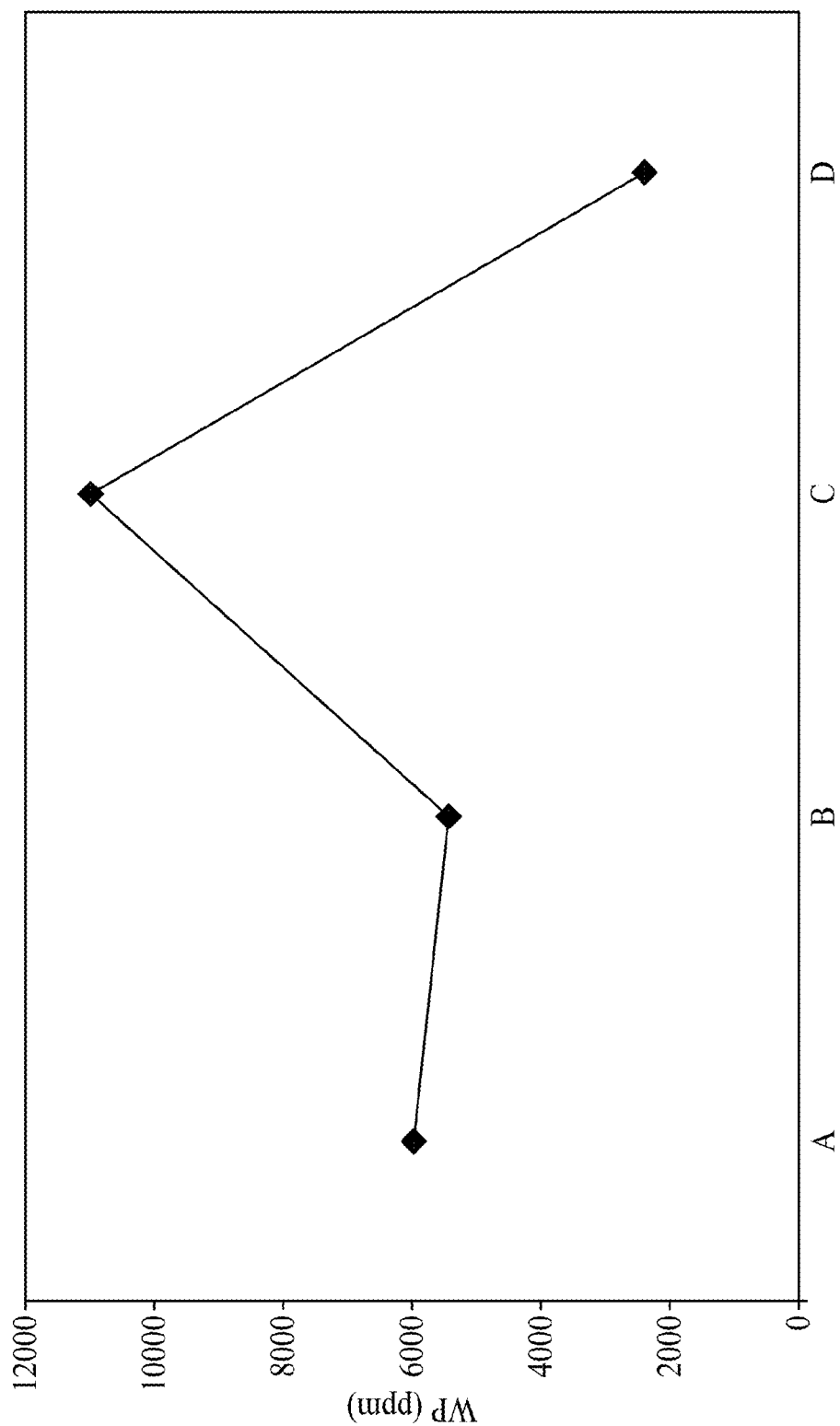
FIG. 15 is a chart showing white pixels analysis results of conventional image sensors and an image sensor according to the present disclosure.

FIG. 15 shows a comparison chart of the measured white pixel (WP) concentrations between an image sensor D including a FSG layer according to the present disclosure and other image sensors A to C. In all the image sensors, the radiation-sensing units are separated from each other by a deep trench isolation structure (DTI). In image sensor A, the liner is directly covered by an ultralow-rate deposited silicon oxide layer (ULRPO). In image sensor B, the liner is directly covered by a low power plasma deposited TiN layer. In image sensor C, the liner is covered by a silicon oxide layer deposited with a low $SiH_4$ flow rate. In image sensor D, the liner is covered by a FSG layer deposited by a low power PECVD operation in accordance with the present disclosure. The chart shows that owing to the advantages of the free fluorine atoms in the FSG layer, the WP concentration is significantly reduced in image sensor D by the FSG layer in accordance with the present disclosure.

Figure 16:
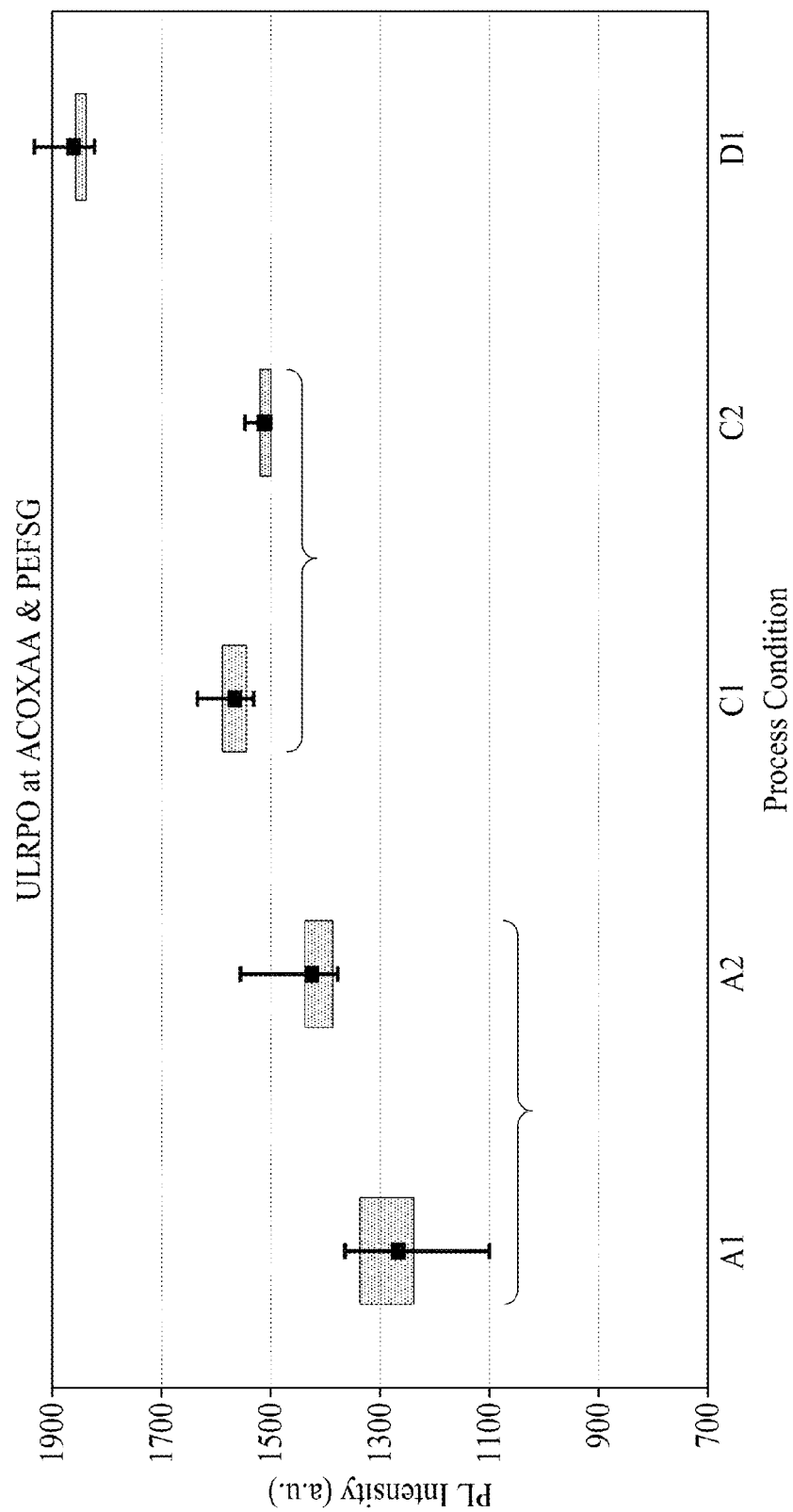
FIG. 16 is a chart showing the PL intensity of conventional image sensors and image sensors according to the present disclosure.

FIG. 16 illustrates the measurement of PL intensity of the image sensors A, C and D as shown in FIG. 15. In FIG. 16, A1 and A2 represent two samples of the image sensor A, C1 and C2 represent two samples of the image sensor C, and D1 represents a sample of the image sensor D of FIG. 15. The PL intensity shows the concentrations of radiation emitted by the samples after adsorption of radiation. A higher PL intensity as sample D1 means a structure having less defects which may trap the radiations to be absorbed or emitted by the sample. In contrast, samples A1, A2, C1 and C2 have structures with more defects. Thus, it is demonstrated that an image sensor having the semiconductor structure (deep trench isolation structure) of the present disclosure have the advantage of reducing the defects in the image sensor by the free fluorine atoms in the FSG layer.

Figure 17:
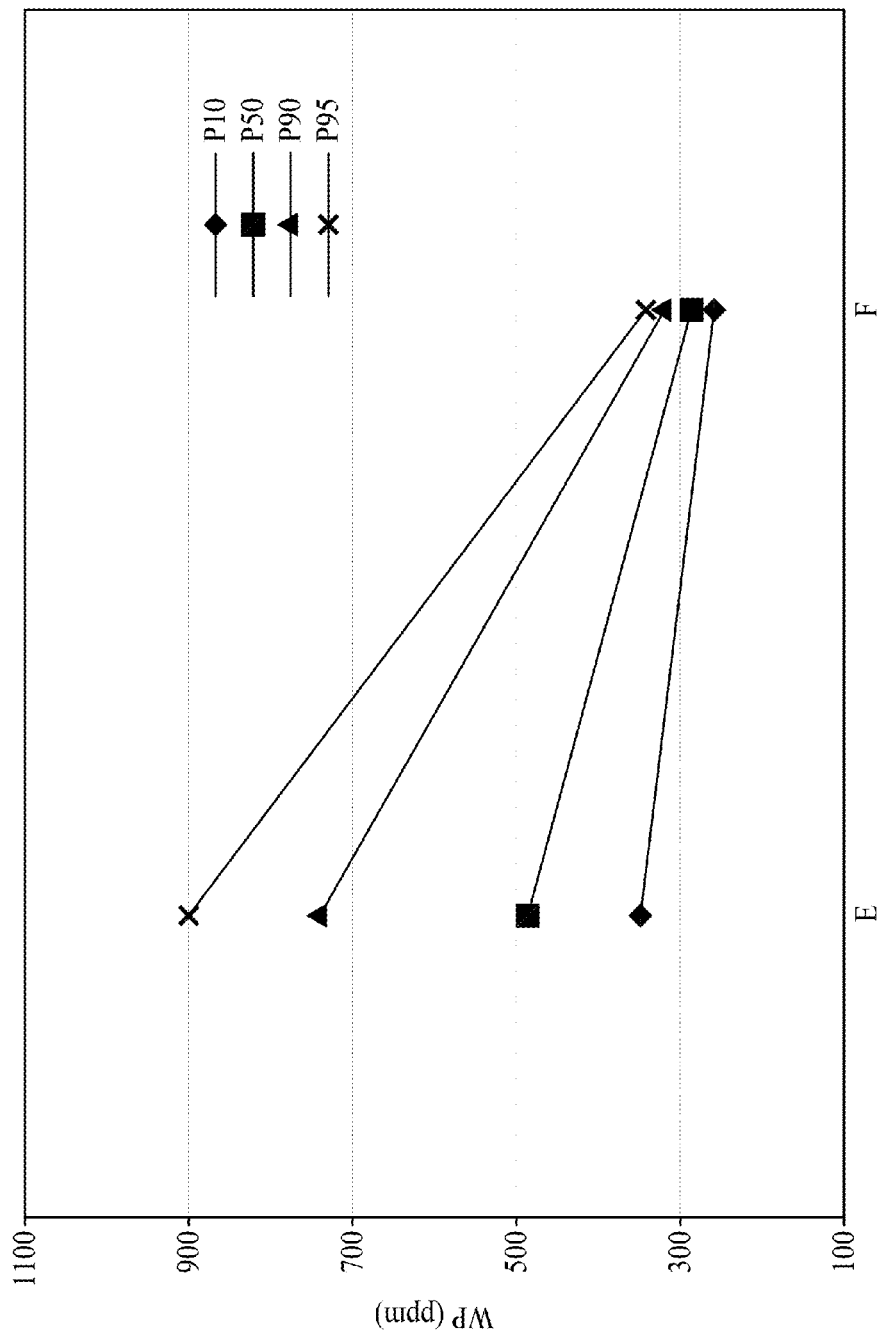
FIG. 17 is a P-chart showing quantity of white pixels in conventional image sensors and image sensors of the present disclosure.

FIG. 17 shows the P-chart quantity of white pixels in different image sensors E and F, each prepared by different operations P10, P50, P90 and P95. In both image sensors E and F, the radiation-sensing units are separated from each other by a deep trench isolation structure. In image sensor E, the liner is covered by a ULRPO layer. In image sensor F, the liner is covered by a FSG layer prepared by a low power PECVD operation in accordance with the present disclosure. The image sensor E fabricated with different operations demonstrates a wide distribution of WP concentrations, from about 350 to about 900 ppm. In comparison, the image sensor F fabricated by operations P10, P50, P90 and P95 show much narrower distribution of WP concentrations, from about 270 to about 350 ppm. Thus, the P-chart in FIG. 17 shows that an image sensor including semiconductor structure with a FSG layer in accordance with the present disclosure has a much more stable quality under different manufacturing operations of the image sensor. Namely, by means of an isolation structure with the FSG layer of the present disclosure, a benefit of maintaining a high quality of image sensor under different manufacturing operations can be achieved.

Based on the above, the present disclosure provides a semiconductor structure including a trench 210 for separating adjacent radiation-sensing units. The trench 210 includes a liner 211, a FSG layer 212, an oxide layer 213, and a reflective material 214. By means of such structure of the present disclosure, the defects and dangling bonds in an images sensor may be significantly reduced, the electric carriers generated in a radiation-sensing unit may be confined in the radiation-sensing unit, the radiation projected toward one radiation-sensing unit may be effectively reflected back to the radiation-sensing unit, and the quality of image sensors can be maintained even under different manufacturing operations.

Some embodiments of the present disclosure provide a semiconductor structure comprising: a substrate, a radiation-sensing region in the substrate, and a trench in the substrate including a liner over an inner wall of the trench, a FSG layer over the line, an oxide layer over the FSG layer, and a reflective material over the oxide layer. The radiation-sensing region of the semiconductor structure comprises a plurality of radiation-sensing units. The trench of the semiconductor structure separates at least two of the radiation-sensing units. The FSG layer of the at least two of the radiation-sensing units comprises at least 2 atomic percent free fluorine and a thickness of from about 500 to about 1300 angstroms.

Some embodiments of the present disclosure provide an image sensor comprising: a substrate with a front surface and a back surface, a radiation-sensing region in proximity to the back surface of the substrate, and a plurality of trench isolation structures in proximity to the back surface of the substrate. The radiation-sensing region includes a plurality of radiation-sensing units. Each of the trench isolation structures of the image sensor separates at least two of the radiation-sensing units and comprises a trench on the back surface of the substrate which includes: a liner over the back surface and an inner wall of the trench, a FSG layer over the line, an oxide layer over the FSG layer, and a reflective material in the trench and over the oxide layer. The FSG layer includes at least 2 atomic percent of free fluorine.

Some embodiments of the present disclosure provide a method of fabricating a semiconductor structure, comprising: receiving a substrate with a front surface and a back surface, forming a trench on the back surface of the substrate, forming a liner over an inner wall of the trench, depositing a FSG layer on the liner by a chemical vapor deposition operation, forming an oxide layer over the FSG layer, and forming a reflective material over the oxide layer. The operation of depositing a FSG layer is implemented using a precursor including a gas molecule containing fluorine and using an RF power of from about 100 W to about 150 W. The FSG layer (212) comprises at least 2 atomic percent free fluorine.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a radiation-sensing region in the substrate, the radiation-sensing region comprising a plurality of radiation-sensing units;
    a trench in the substrate, separating at least two of the radiation-sensing units, wherein the trench comprises:
        a liner over an inner wall of the trench;
        a fluorine-doped silicate glass (FSG) layer over the liner, wherein the FSG layer comprises at least 2 atomic percent free fluorine and a thickness of from about 500 to about 1300 angstroms;
        an oxide layer over the FSG layer; and
        a reflective material over the oxide layer.

2. The semiconductor structure of claim 1, wherein the trench comprises a width of from about 0.15 to about 0.3 µm.

3. The semiconductor structure of claim 1, wherein an aspect ratio of the trench is in a range of from about 1.5 to about 10.

4. The semiconductor structure of claim 1, wherein the reflective material is a conductive material including tungsten, aluminum, copper, or any combinations thereof.

5. The semiconductor structure of claim 1, wherein the liner is a high-k dielectric layer composed of at least one of $HfO_2$, $Al_2O_3$, $TiO_2$, $HfZrO$, $Ta_2O_3$, $Ta_2O_5$, $HfSiO_4$, $ZrO_2$, $ZrSiO_2$, and lanthanide oxides.

6. The semiconductor structure of claim 5, wherein the liner has a thickness of from about 15 Å to about 30 Å.

7. The semiconductor structure of claim 6, wherein the FSG layer separates the liner from the oxide layer.

8. An image sensor, comprising:
    a substrate, comprising a front surface and a back surface;
    a radiation-sensing region in proximity to the back surface of the substrate, wherein the radiation-sensing region includes a plurality of radiation-sensing units;
    a plurality of trench isolation structures in proximity to the back surface of the substrate, wherein each of the plurality of trench isolation structures separates at least two of the radiation-sensing units and comprises:
        a trench on the back surface of the substrate;
        a liner over the back surface and an inner wall of the trench;
        a fluorine-doped silicate glass (FSG) layer over the liner, wherein the FSG layer including at least 2 atomic percent of free fluorine;
        an oxide layer over the FSG layer; and
        a reflective material in the trench and over the oxide layer;
    an anti-reflection coating layer over the radiation-sensing region; and
    a plurality of color filters over the anti-reflection coating layer.

9. The image sensor of claim 8, wherein the FSG layer has a thickness of from about 500 to about 1300 angstroms.

10. The image sensor of claim 8, wherein the FSG layer separates the liner from the oxide layer.

11. The image sensor of claim 8, wherein the liner is a high-k dielectric layer composed of at least one of $HfO_2$, $Al_2O_3$, $TiO_2$, $HfZrO$, $Ta_2O_3$, $Ta_2O_5$, $HfSiO_4$, $ZrO_2$, $ZrSiO_2$, or lanthanide oxides.

12. The image sensor of claim 11, wherein the liner has a thickness of from about 15 Å to about 30 Å.

13. The image sensor of claim 8, wherein the trench has a depth of from about 1 to about 3 μm.

14. The image sensor of claim 8, wherein each of the plurality of trench isolation structures comprises a cover layer over the reflective material and the oxide layer, a height of the cover layer over the back surface being from about 1200 to about 1800 angstroms.

15. A method of fabricating a semiconductor structure, comprising:
- receiving a substrate with a front surface and a back surface;
- forming a trench on the back surface of the substrate;
- forming a liner over an inner wall of the trench;
- depositing a fluorine-doped silicate glass (FSG) layer on the liner by a chemical vapor deposition operation by using a precursor including a gas molecule containing fluorine, wherein the FSG layer comprises at least 2 atomic percent free fluorine.

16. The method of claim 15, wherein forming the liner includes depositing at least a high-k dielectric layer composed of at least one of hafnium oxide ($HfO_2$), $Al_2O_3$, $TiO_2$, HfZrO, $Ta_2O_3$, $Ta_2O_5$, $HfSiO_4$, $ZrO_2$, $ZrSiO_2$.

17. The method of claim 15, wherein the FSG layer comprises a thickness of from about 500 to about 1300 angstroms.

18. The method of claim 15, wherein the gas molecule used as the precursor is $SiF_4$.

19. The method of claim 15, wherein depositing the FSG layer by the chemical vapor deposition operation includes using an RF power of from about 100 W to about 150 W.

20. The method of claim 15, wherein the forming the trench on the back surface of the substrate comprises forming the trench having a greater depth than that of two adjacent radiation-sensing units separated by the trench.

\* \* \* \* \*